(12) United States Patent
Fey (10) Patent No.: US 10,241,005 B2
(45) Date of Patent: Mar. 26, 2019

(54) METHOD FOR DETECTING A VOLTAGE OFFSET AT LEAST IN A PORTION OF A VOLTAGE LAMBDA CHARACTERISTIC CURVE

(71) Applicant: Robert Bosch GmbH, Stuttgart (DE)

(72) Inventor: Michael Fey, Wiernsheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 141 days.

(21) Appl. No.: 15/529,181

(22) PCT Filed: Nov. 19, 2015

(86) PCT No.: PCT/EP2015/077089
§ 371 (c)(1),
(2) Date: May 24, 2017

(87) PCT Pub. No.: WO2016/083232
PCT Pub. Date: Jun. 2, 2016

(65) Prior Publication Data
US 2017/0322115 A1     Nov. 9, 2017

(30) Foreign Application Priority Data
Nov. 24, 2014 (DE) .................. 10 2014 223 864

(51) Int. Cl.
*G01M 15/10*    (2006.01)
*F02D 41/14*    (2006.01)
(Continued)

(52) U.S. Cl.
CPC ......... *G01M 15/104* (2013.01); *F01N 11/007* (2013.01); *F02D 41/1454* (2013.01);
(Continued)

(58) Field of Classification Search
USPC ............... 73/114.69, 114.71, 114.72, 114.73
See application file for complete search history.

(56) References Cited

U.S. PATENT DOCUMENTS 6,497,135 B1 * 12/2002 Sanders ............ G01N 27/4065
123/693
2010/0258099 A1 * 10/2010 Andersson ............ F02D 31/006
123/676
(Continued)

FOREIGN PATENT DOCUMENTS

DE       19860463 A1    7/2000
DE    102012211683 A1    1/2014
(Continued)

OTHER PUBLICATIONS

International Search Report dated Feb. 22, 2016 of the corresponding International Application No. PCT/EP2015/077089 filed Nov. 19, 2015.

*Primary Examiner* — Eric S. McCall
(74) *Attorney, Agent, or Firm* — Norton Rose Fulbright US LLP; Gerard Messina (57) ABSTRACT

A method for a two-point lambda sensor includes, changing a composition of an air/fuel mixture supplied to an internal combustion engine from a predefined lambda value to lambda=1, determining a delay time of the voltage value reaching a value corresponding to the lambda=1, again changing the composition of the air/fuel mixture from the predefined lambda value to lambda=1, determining a characteristic of the changing performed in the second regulation based on the delay time, determining an actual value of lambda on an actual voltage-lambda characteristic curve of the two-point lambda sensor that corresponds to the predefined lambda value which is in reference to a reference voltage-lambda characteristic curve based on the determined characteristic, and identifying a voltage offset between the
(Continued)

characteristic curves based on a deviation of the actual value from the predefined value.

13 Claims, 2 Drawing Sheets

(51) Int. Cl.
    *F02D 41/24*     (2006.01)
    *F01N 11/00*     (2006.01)
    *G01R 17/02*     (2006.01)

(52) U.S. Cl.
    CPC ..... *F02D 41/1474* (2013.01); *F02D 41/2445* (2013.01); *F02D 41/2474* (2013.01); *G01R 17/02* (2013.01); *F01N 2560/025* (2013.01); *F02D 41/1475* (2013.01); *F02D 41/2438* (2013.01); *F02D 2041/1431* (2013.01)

(56) References Cited

U.S. PATENT DOCUMENTS

| | | |
|---|---|---|
| 2011/0040472 A1 | 2/2011 | Rayl et al. |
| 2012/0116654 A1 | 5/2012 | Toyohara et al. |
| 2014/0007644 A1* | 1/2014 | Fey .................. G01N 33/0006 73/1.06 |
| 2014/0012486 A1* | 1/2014 | Fey ........................ F02D 41/00 701/103 |
| 2014/0311459 A1 | 10/2014 | Katsurahara |
| 2015/0135802 A1* | 5/2015 | Fey .................. F02D 41/1454 73/23.21 |

FOREIGN PATENT DOCUMENTS

| | | |
|---|---|---|
| DE | 102012211687 A1 | 1/2014 |
| EP | 1088978 A2 | 4/2001 |
| FR | 2877400 A1 | 5/2006 |

\* cited by examiner

METHOD FOR DETECTING A VOLTAGE OFFSET AT LEAST IN A PORTION OF A VOLTAGE LAMBDA CHARACTERISTIC CURVE

CROSS-REFERENCE TO RELATED APPLICATIONS

The present application is the national stage of International Pat. App. No. PCT/EP2015/077089 filed Nov. 19, 2015, and claims priority under 35 U.S.C. § 119 to DE 10 2014 223 864.1, filed in the Federal Republic of Germany on Nov. 24, 2014, the content of each of which is incorporated herein by reference in its entirety.

BACKGROUND

From the existing art, a large number of sensor elements and methods are known for acquiring at least one property of a measurement gas in a measurement gas compartment. In principle, these can be any physical and/or chemical properties of the measurement gas, and one or more properties can be acquired.

For example, such sensor elements can be fashioned as so-called lambda sensors, as known for example from Konrad Reif (pub.): Sensoren im Kraftfahrzeug, 1$^{st}$ edition 2010, pp. 160-165. With broadband lambda sensors, in particular planar broadband lambda sensors, for example the oxygen concentration in the exhaust gas can be determined in a large range, and in this way the air/fuel ratio in the combustion chamber can be inferred. The air index $\lambda$ describes this air/fuel ratio.

From the existing art, in particular ceramic sensor elements are known that are based on the use of electrolytic properties of particular solid bodies, i.e., on ion-conducting properties of these solid bodies. These solid bodies can for example be ceramic solid electrolytes, such as zirconium dioxide ($ZrO_2$), in particular yttrium-stabilized zirconium dioxide (YSZ), and scandium-doped zirconium dioxide (ScSZ), which can contain small additives of aluminum oxide ($Al_2O_3$) and/or silicon oxide ($SiO_2$).

To optimize pollutant emissions and exhaust gas post-treatment, in modern internal combustion engines lambda sensors are used to determine the composition of the exhaust gas and to control the internal combustion engine. Lambda sensors determine the oxygen content of the exhaust gas, which is used to regulate the air/fuel mixture supplied to the internal combustion engine and thus the exhaust gas lambda before a catalytic converter. Here, via a lambda regulating circuit the air and fuel supply to the internal combustion engine is regulated in such a way that a composition of the exhaust gas is achieved that is optimal for the exhaust gas post-treatment by catalytic converters provided in the exhaust duct of the internal combustion engine. In spark-ignition engines, as a rule regulation takes place to a lambda value of 1, i.e., a stoichiometric ratio of air to fuel. In this way, the pollutant emission of the internal combustion engine can be minimized.

Various forms of lambda sensors are in use. A broadband lambda sensor, also referred to as a constant or linear lambda sensor, enables the measurement of the lambda value in the exhaust gas in a broad range around lambda=1. In this way, for example an internal combustion engine can also be regulated to a lean operation with an air excess. Through a linearization of the sensor characteristic curve, a constant lambda regulation before the catalytic converter is also possible using a lower-cost two-point lambda sensor, though in a limited lambda range. In such a two-point lambda sensor, also called a discrete-level sensor or Nernst sensor, the voltage-lambda characteristic curve has an abrupt dropoff at $\lambda=1$. It therefore essentially permits a distinction to be made between a rich exhaust gas ($\lambda<1$) during operation of the internal combustion engine with a fuel excess and lean exhaust gas ($\lambda>1$) during operation with an air excess, and permits regulation of the exhaust gas to a lambda value of 1.

A precondition for the constant lambda regulation with a two-point lambda sensor is that an unambiguous relation exists between the sensor voltage of the two-point lambda sensor and lambda. This relation must be present over the entire lifespan of the two-point lambda sensor, because otherwise the precision of the regulation is not adequate, and impermissibly high emissions can occur. This precondition is not met due to manufacturing tolerances and aging effects of the two-point lambda sensor. Instead, the actual sensor characteristic curve can be shifted relative to the reference sensor characteristic curve by a plurality of superposed effects.

Therefore, two-point lambda sensors before the catalytic converter are usually used with a two-point regulation. This has the disadvantage that in operating modes for which a lean or rich air/fuel mixture is required, for example for catalytic converter diagnosis or for component protection, the target lambda can be set only in pre-controlled fashion, but cannot be regulated.

Despite the advantages of methods known from the existing art for recognizing a voltage offset of a voltage-lambda characteristic curve, these methods still have room for potential improvement. Thus, DE 10 2012 211 687 A1 describes a method for recognizing a voltage offset of a voltage-lambda characteristic curve, with which shifts of the actual sensor characteristic curve relative to the reference characteristic curve can be recognized and compensated. In this way, a constant lambda regulation with a two-point lambda sensor before the catalytic converter is possible. For the recognition of temperature-caused characteristic curve shifts, this method uses a change in the air/fuel mixture based on a value pair that is to be checked on the reference voltage-lambda characteristic curve of the two-point lambda sensor up to lambda=1. From the change of the composition of the air/fuel mixture up to the reaching of lambda=1, the actual value of lambda before the change is inferred. This procedure presupposes that the change takes place with a clearly defined profile, such as for example a ramp shape having a clearly defined rise.

As a rule, this precondition is not met at all engine operating points. In particular given short injection times, the injection valve characteristic curve, which describes the functional dependence of the injected fuel quantity on the injection time, is as a rule wavy, and a reference injection valve characteristic curve, stored in the control device, takes this waviness into account.

SUMMARY

However, due to component tolerances, deviations can occur between the real injection valve characteristic curve and the reference injection valve characteristic curve. These deviations have the result that temperature-caused characteristic curve shifts of the two-point lambda sensor at corresponding engine operating points can be determined only imprecisely. This imprecision can be more noticeable in engines having direct gasoline injection and a small cylinder capacity, where short injection times occur relatively frequently.

Therefore, a method for recognizing a voltage offset at least in a region of a voltage-lambda characteristic curve is described that expands the range of applicability of the above methods acquiring at least one property of a measurement gas in a measurement gas compartment, and in which, in particular, tolerances of the injection valve characteristic curve can be taken into account in the recognition of characteristic curve shifts of a two-point lambda sensor.

In the following, the present invention is described in particular with reference to a qualitative and/or quantitative acquisition of a portion of a gas component of the measurement gas, in particular with reference to an acquisition of an oxygen portion in the measurement gas part. The oxygen portion can for example be acquired in the form of a partial pressure and/or in the form of a percentage. Alternatively or in addition, however, other properties of the measurement gas can also be acquired, such as the temperature.

In an example embodiment of the present invention, a method is executed for recognizing a voltage offset at least in part of a voltage-lambda characteristic curve of a two-point lambda sensor relative to a reference voltage-lambda characteristic curve of the two-point lambda sensor. The two-point lambda sensor is situated in an exhaust duct of an internal combustion engine and is used in a regulation for setting an air/fuel mixture supplied to the internal combustion engine, a deviation of the voltage-lambda characteristic curve from the reference voltage-lambda characteristic curve being corrected based on a regulation to lambda=1, a change of the composition of the air/fuel mixture supplied to the internal combustion engine to lambda=1 taking place on the basis of a value pair on the reference voltage-lambda characteristic curve having a lambda to be checked and a voltage to be checked, and the actual value of lambda being inferred from a characteristic of the change of the composition of the air/fuel mixture until lambda equals 1 is achieved, where a delay time of the regulation path is determined in a first method step and the change of the composition of the air/fuel mixture to lambda=1 takes place in a second method step based on the value pair to be checked, the characteristic of the change of the composition being corrected based on the delay time of the regulation path, the actual value of lambda in the value pair being determined from the corrected characteristic, a voltage offset of the voltage-lambda characteristic curve being recognized from a deviation of the actual value of lambda from the value of lambda to be checked, the first method step and the second method step being carried out if a threshold value of a property of an injected quantity of fuel supplied to the internal combustion engine is exceeded or fallen below.

The property of an injected quantity of fuel supplied to the internal combustion engine whose threshold value is exceeded can be an injection time. The threshold value can be 2.0 ms, and preferably 2.5 ms. The threshold value can be changed as a function of at least one operating point of the internal combustion engine. The operating point can for example be selected from the group of: decrease in a rail pressure of the internal combustion engine, simple injection, injection angle displacement, and switching off of at least one cylinder. In order to carry out the method, waiting can take place until, based on an operating point of the internal combustion engine, the threshold value is exceeded and/or an operating point of the internal combustion engine is changed in such a way that the threshold value is exceeded.

The method can be carried out repeatedly. The method can be carried out after waiting until the threshold value has been exceeded, based on an operating point of the internal combustion engine, and subsequently the method can be carried out after an operating point of the internal combustion engine has been changed in such a way that the threshold value has been exceeded. Alternatively, the method can be carried out after an operating point of the internal combustion engine has been changed in such a way that the threshold value has been exceeded and subsequently the method has been carried out after waiting has taken place until, based on an operating point of the internal combustion engine, the threshold value is exceeded.

In the first method step, based on the value pair to be checked, an abrupt change of the composition of the air/fuel mixture to a value beyond lambda=1 can be carried out, and the delay time can be determined from the temporal difference between the abrupt change of the composition of the air/fuel mixture and the reaching of the output voltage, corresponding to lambda=1, of the two-point lambda sensor. In the second method step, based on the value pair to be checked, a change of the composition of the air/fuel mixture to a value beyond lambda=1 can be carried out with a second ramp-shaped change of the composition of the air/fuel mixture at least in the region around lambda=1, and the actual lambda in the value pair to be checked can be determined from the change of the composition of the air/fuel mixture up to the reaching of the output voltage, corresponding to lambda=1, of the two-point lambda sensor minus the change of the composition of the air/fuel mixture during the delay time of the regulation path.

A recognized voltage offset of the voltage-lambda characteristic curve can be corrected with the actual value of lambda, and/or as a function of the recognized voltage offset one or more causes of the voltage offset can be inferred, and measures can be taken to prevent or mitigate the causes. In the first method step, a first ramp-shaped change of the composition of the air/fuel mixture can be provided for the determination of the delay time of the regulation path, and the rise of the second ramp-shaped change can be adapted to the operating point of the internal combustion engine, and/or in the second method step the rise of the second ramp-shaped change of the composition of the air/fuel mixture can be adapted to the operating point of the internal combustion engine. The composition of the air/fuel mixture in the value pair to be checked can be held constant for a stabilization duration of the output signal of the two-point lambda sensor. The voltage offset can be recognized for various lambda regions, in particular for a rich and a lean lambda region. The value pairs to be checked can be selected such that a specified target lambda is maintained on average over time. The recognition of the voltage offset can be plausibilized through repeated measurements with the same value pair, or through measurements with different value pairs. The recognition of the voltage offset can be plausibilized during an overrun cutoff of the internal combustion engine. The value pair to be checked can be set in a targeted fashion and/or the recognition of the voltage offset can take place for a value pair occurring during operation of the internal combustion engine. The recognition of the voltage offset can be carried out during an operating point of the internal combustion engine that is constant for the duration of the recognition. Before a new recognition of the voltage offset, the correction of the voltage offset from a preceding operating cycle of the internal combustion engine can be used.

An example embodiment of the present invention is directed to a computer program set up to carry out each step of the method according to the present invention.

An example embodiment of the present invention is directed to an electronic storage medium on which such a computer program is stored.

An example embodiment of the present invention is directed to an electronic control device that includes the stated electronic storage medium having a computer program according to the present invention for carrying out the method according to the present invention.

A basic idea of the present invention is a limitation of the recognition of characteristic curve shifts of a two-point lambda sensor to engine operating points at which tolerances of the injection valve characteristic curve are negligible, and/or the active bringing about of injection times that are well-suited for the recognition. An advantage of this method is that the precision and/or the run frequency of the recognition of characteristic curve shifts of a two-point lambda sensor is improved, which, in turn, increases the precision of a constant lambda regulation with a low-cost two-point lambda sensor.

In the following, as an example it is assumed that short injection times can negatively influence the recognition of characteristic curve shifts of the two-point lambda sensor. However, the present invention can usefully also be applied to other unfavorable injection time regions. In principle, the present invention provides two types of methods that can be used individually or in combination.

In the passive method, the recognition of characteristic curve shifts of a two-point lambda sensor are limited to engine operating points having sufficiently long injection times. In particular, it is provided to limit the recognition of temperature-caused characteristic curve shifts to engine operating points in which the above-described precondition, i.e., that the change of the composition of the air/fuel mixture takes place with a clearly defined profile, is met. This limitation takes place for example through an activation condition that prevents the recognition from being activated when injection times are too short. Preferably, a threshold value for the injection time is ascertained below which the waviness of the injection valve characteristic curve means that an adequately precise recognition is not to be expected. A typical value for this is 2.5 ms. If the injection time falls below this threshold, the recognition is not activated. It is advantageous to make the threshold value variable as a function of other conditions, such as the engine operating point.

Through the passive method, the precision of the recognition of characteristic curve shifts of a two-point lambda sensor is improved. At the same time, the opportunities for the recognition when there is an unfavorable driving profile, for example when adequately high injection times are too seldom achieved, is reduced.

In order to avoid this disadvantage of the passive method, in the active method longer injection times are brought about in a targeted fashion during the recognition of characteristic curve shifts of a two-point lambda sensor, because in the case of longer injection times the waviness of the injection valve characteristic curve is standardly small enough that it does not negatively influence the recognition. For this purpose, it is provided that the functionality for recognizing characteristic curve shifts actively requests an increase in the injection times by the engine control system. In order to influence other functionalities in the engine control system as little as possible, this active request preferably takes place only when conditions are present under which the injection time can be sufficiently greatly increased, and under which such an increase can be expected to result in a successful recognition. Examples of possibilities for increasing the injection time are the lowering of the rail pressure, a single injection instead of a multiple injection, and ignition angle displacement in order to achieve a lower degree of efficiency, or the switching off of individual cylinders. The recognition of characteristic curve shifts of the two-point lambda sensor then takes place with higher injection times, and thus more precisely. As soon as the recognition has terminated, the injection times are again reduced.

As a further alternative, the combination of both methods is provided. Here, at first the passive method can be used. In this way, it is ensured that the measurements for recognizing characteristic curve shifts are not falsified by too-short injection times. If no recognition is possible over a longer time using the passive method, for example because the injection times are too short for a long period of time, waiting takes place for operating conditions in which the current injection time is indeed too short, but an active injection time would be promising. As soon as this is the case, an increase of the injection time is actively requested, i.e., a change takes place to the active method, and thus a more precise measurement with higher injection times is enabled. Following the recognition, a change takes place back to the passive method.

Because an individual measurement is standardly not sufficient for a reliable recognition and compensation of characteristic curve shifts if no measurement has taken place previously, for example directly after vehicle assembly or after a change of the lambda sensor, in such cases it can be advantageous first to activate the active method in order to quickly permit a first reliable compensation, and subsequently to change over to the passive method.

Further optional details and features of the present invention result from the following description of preferred exemplary embodiments, shown schematically in the Figures.

DETAILED DESCRIPTION

Figure 1:
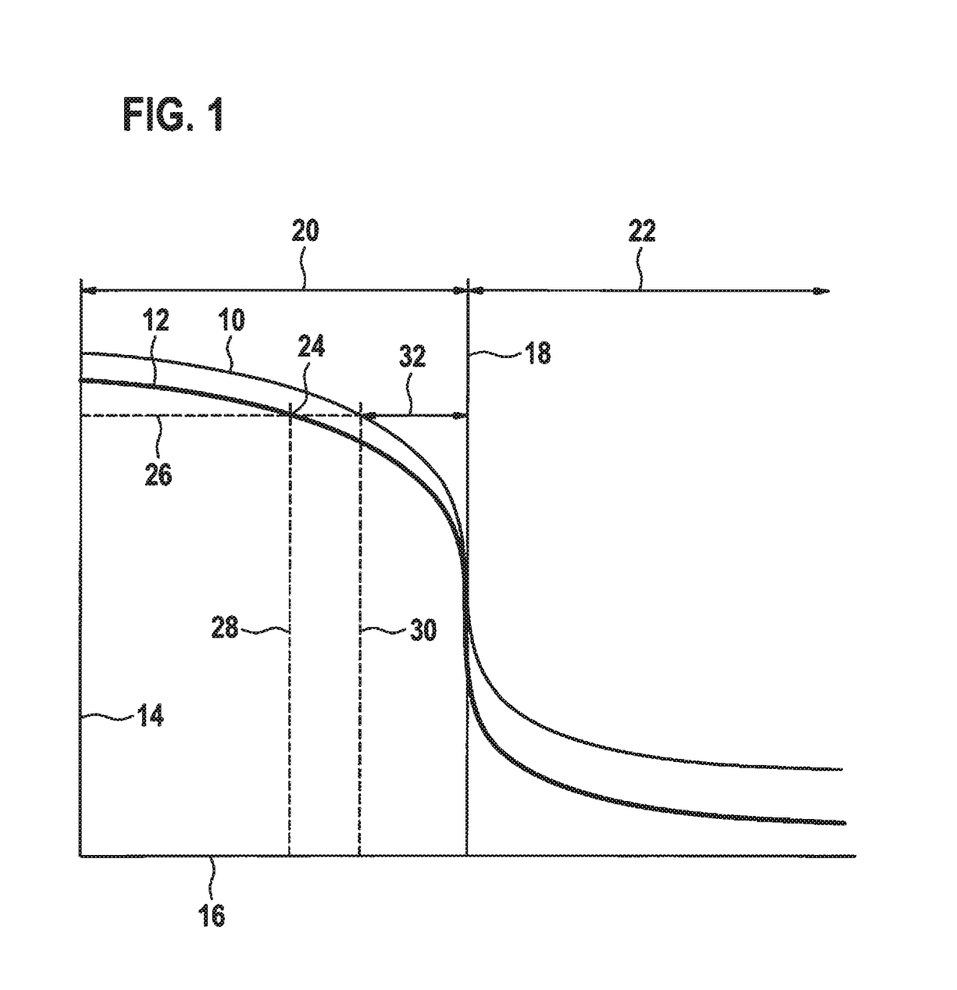
FIG. 1 shows a voltage-lambda characteristic curve of a two-point lambda sensor having a voltage offset in relation to a reference voltage-lambda characteristic curve which is identified according to an example embodiment of the present invention.

FIG. 1 shows a voltage-lambda characteristic curve 10 of a two-point lambda sensor having a voltage offset in relation to a reference voltage-lambda characteristic curve 12. Characteristic curves 10, 12 are plotted against an axis of sensor voltage 14 and against an axis of lambda 16.

The depicted lambda region is divided, by a marking 18 at lambda=1, into a rich lambda region 20 with lambda<1 and a lean lambda region 22 with lambda>1.

A value pair 24 to be checked is shown at the point of intersection of two dotted lines on reference voltage-lambda characteristic curve 12, by a voltage 26 to be checked and a lambda 28 to be checked. An actual value of lambda 30 is marked for voltage 26 to be checked on voltage-lambda characteristic curve 10. A lambda change 32 based on a change of the air/fuel mixture supplied to the internal combustion engine, and thus of lambda until the value of lambda=1 is reached, is shown by a double arrow.

Reference voltage-lambda characteristic curve 12 corresponds to the curve of the output signal of an intact, unaged two-point lambda sensor in the exhaust duct of an internal combustion engine given a change in the exhaust gas composition. It has its maximum slope at lambda=1. The jump from a high output voltage to a low output voltage takes place in a comparatively small lambda window. Due to aging, manufacturing tolerances, or changed operating conditions of the two-point lambda sensor, its output voltage can be shifted by a voltage offset relative to reference voltage-lambda characteristic curve 12.

In the present exemplary embodiment, voltage-lambda characteristic curve 10 is shifted by a positive voltage offset relative to reference voltage-lambda characteristic curve 12. Here, the voltage offset is more strongly marked in lean lambda region 22 than in rich lambda region 20. Such a curve of the voltage offset is known for example for two-point lambda sensors that are operated too hot, which at the same time have a constant voltage offset over the entire characteristic curve.

The use of a two-point lambda sensor for a constant lambda regulation before the catalytic converter presupposes that a corresponding exhaust gas lambda can be unambiguously assigned to a particular sensor voltage. This is the case for reference voltage-lambda characteristic curve 12. If a voltage offset of the actual voltage-lambda characteristic curve 10 relative to reference voltage-lambda characteristic curve 12 is present, this assignment is no longer correct. When there is a voltage offset to higher sensor voltages, as is shown in the depicted exemplary embodiment, a specified sensor voltage arises at a too-lean lambda. When there is an offset to lower sensor voltages, the same sensor voltage arises at a too-rich lambda. A lambda regulation having a voltage-lambda characteristic curve 10 shifted by a positive voltage offset accordingly results in a too-lean exhaust gas, while a voltage-lambda characteristic curve 10 shifted by a negative voltage offset results in a too-rich exhaust gas, which results in each case in increased pollutant emissions of the internal combustion engine.

A voltage offset of voltage-lambda characteristic curve 10 can be recognized in that the actual value of lambda 30 and a voltage 26 to be checked of the two-point lambda sensor is determined from a change, carried out in targeted fashion, of the air/fuel ratio supplied to the internal combustion engine until the value lambda=1 is reached, and is compared with lambda 28 to be checked. If there is a deviation, the actual value of lambda 30 can be assigned to voltage 26 to be checked, and in this way voltage-lambda characteristic curve 10 can be corrected. Here, the voltage-lambda characteristic curve is preferably corrected in a larger region, for example in rich lambda region 20.

Thus, possible dynamic effects of the two-point lambda sensor are taken into account in the determination of the actual value of lambda 30. The dynamic effects can be based in a dynamic loss of the two-point lambda sensor caused by aging, and their influence is to be ascertained before the determination of the actual value of lambda 30.

Alternatively or in addition to the correction of voltage-lambda characteristic curve 10, the cause of the voltage offset can be inferred from the voltage offset, or from the curve of the voltage offset, and measures can be taken to avoid or reduce the influence of the causes. In the depicted exemplary embodiment, for example, first the constant voltage offset can be corrected, and subsequently the temperature of the two-point lambda sensor can be reduced in order to adapt voltage-lambda characteristic curve 10 to reference voltage-lambda characteristic curve 12.

A precondition for the described recognition of a voltage offset is that a shift that may exist of the lambda-1 point, as well as a constant offset of voltage-lambda characteristic curve 10, has already been compensated previously using known methods, so that at the lambda-1 point voltage-lambda characteristic curve 10 agrees with reference voltage-lambda characteristic curve 12.

The correction and the compensation of causes can be carried out separately in different regions of voltage-lambda characteristic curve 10. In the case of complete compensation, voltage-lambda characteristic curve 10 coincides with reference voltage-lambda characteristic curve 12. In this way, it is possible to obtain an unambiguous relation between the sensor voltage and lambda even in an aged two-point lambda sensor. In this way, a constant lambda regulation before the catalytic converter can be carried out even using a two-point lambda sensor, which is lower in cost compared to a broadband lambda sensor.

Figure 2:
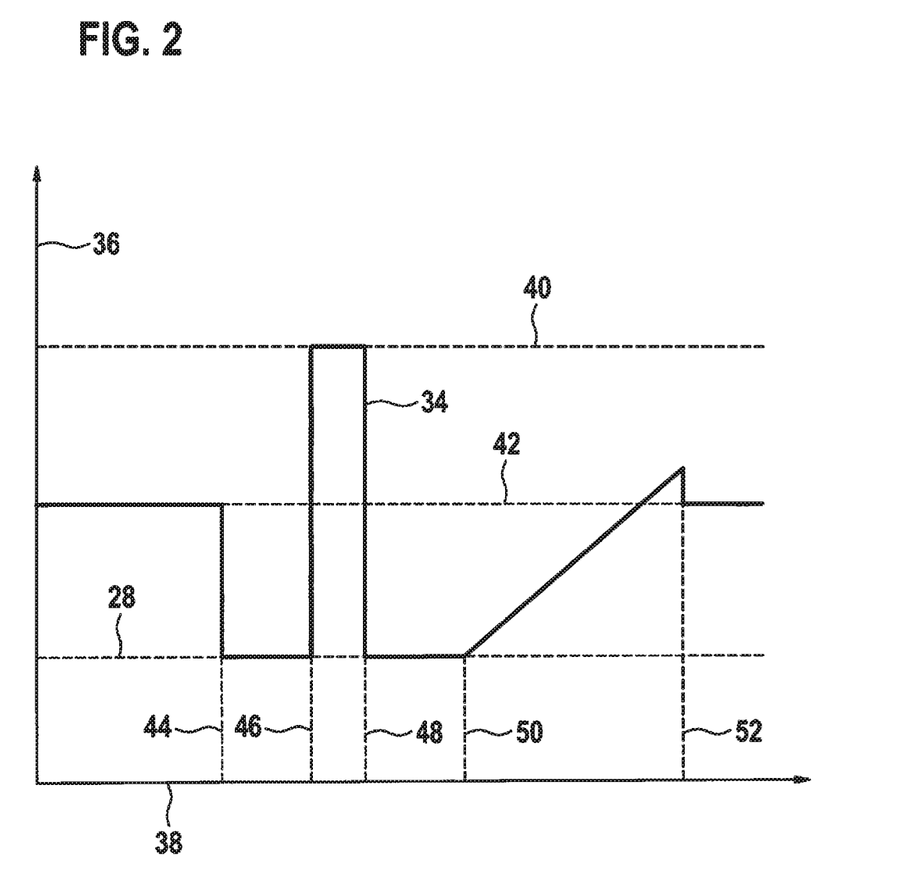
FIG. 2 shows a temporal lambda curve for the recognition of a voltage offset according to an example embodiment of the present invention.

FIG. 2 shows, in an exemplary embodiment, a temporal lambda curve 34 for recognizing a voltage offset in a two-point lambda sensor that reacts with a delay. Lambda curve 34 is plotted against an axis of lambda 36 and a time axis 38. A lean lambda 40, a target lambda=1 42, and lambda 28 to be checked, shown in FIG. 1, are marked by dotted lines against the lambda axis 36. Correspondingly, a first time 44, a second time 46, a third time 48, a fourth time 50, and a fifth time 52 are shown against time axis 38.

Lambda 28 that is to be checked is part of a value pair 24 to be checked that is shown in FIG. 1, on reference voltage-lambda characteristic curve 12 of the two-point lambda sensor. In the exemplary embodiment, lambda 28 that is to be checked has for example a value of 0.95.

The two-point lambda sensor is part of a regulation path for setting an air/fuel mixture supplied to the internal combustion engine. In a first method step for determining a delay time of the regulation path, at first time 44 the air/fuel mixture supplied to the internal combustion engine is modified in such a way that, corresponding to reference voltage-lambda characteristic curve 10, lambda 28 to be checked is present. After a specified stabilization time for the sensor voltage, at second time 46 there takes place an abrupt lambda change, going beyond lambda=1, to a lean lambda 40 having for example the value 1.05.

The abrupt lambda change from a rich to the lean lambda 40 brings about a change in the sensor to the voltage at lambda=1. This change in the sensor voltage takes place with a delay due to dynamic effects. The delay time between the abrupt lambda change and the change to the sensor voltage at lambda=1 is measured.

After the delay time of the regulation path has been determined, in a second method step, at third time 48, lambda 28 to be checked is again set and is held constant for a stabilization time. At fourth time 50, the output voltage of the two-point lambda sensor is measured. Based on lambda 28 that is to be checked, starting from fourth time 50 there takes place a ramp-shaped lambda change in the direction of leaner lambda values. The rise of the ramp-shaped lambda change is here preferably constant and adapted to the operating point of the internal combustion engine.

The ramp-shaped lambda change from a rich to a lean lambda also causes a change in the sensor to the voltage at lambda=1. This change also takes place with a delay at fifth time 52. The delay time here corresponds to the delay time measured in the first method step.

Immediately after the change in the sensor voltage to that at lambda=1, the ramp-shaped lambda change can be terminated, and a desired target lambda can be set.

The actual value of lambda 30 at fourth time 50, immediately at the beginning of the ramp-shaped lambda change, corresponds to the lambda change that was necessary until the sensor voltage reached the value at fifth time 52, at lambda=1, minus the lambda change that took place during the delay time measured in the first method step.

The deviation between the actual value of lambda 30, ascertained at fourth time 50, and lambda 28 that is to be checked and that is expected for the output voltage at fourth time 50 according to reference voltage-lambda characteristic curve 12 corresponds to the characteristic curve offset at this point of voltage-lambda characteristic curve 10.

By ascertaining the influence of dynamic effects immediately before the measurement of the actual value of lambda 30, the lambda measurement becomes significantly more precise compared to previous methods. The ascertained characteristic curve offset can subsequently be used for an adaptation of the sensor characteristic curve or for a compensation of causes that led to the offset.

The abrupt or ramp-shaped lambda changes described in the first method step and in the second method step are particularly advantageous for a rapid and precise recognition of a characteristic curve offset. In principle, however, other types of lambda changes are also conceivable that permit ascertaining of the influence of dynamic effects as well as the ascertaining of the actual lambda 30 at a particular sensor voltage.

The stabilization times and the ramp rise can be adapted to the respective operating point of the internal combustion engine in order to increase the precision of the recognition.

If a characteristic curve offset as shown in the exemplary embodiment of FIG. 1 is differently pronounced in different regions of voltage-lambda characteristic curve 10, the method can be applied to correspondingly more value pairs 24 that are to be checked, and the voltage offset can be ascertained in segments.

The ascertained voltage offset can be plausibilized by repeating the measurement at the same point or at other points of voltage-lambda characteristic curve 10. By averaging or filtering the measurement result, the recognition can be improved.

In internal combustion engines that permit overrun compensation, the ascertained characteristic curve offset can be plausibilized by a measurement during an overrun compensation.

It is advantageous to store a characteristic curve offset that was ascertained in a preceding operating cycle of the internal combustion engine and to take it over in the following operating cycle. It can be assumed that a characteristic curve offset will change only slowly. Thus, in the next operating cycle a corrected voltage-lambda characteristic curve 10 of the two-point lambda sensor will immediately be present.

The described lambda changes can be actively set for the recognition of a voltage offset. Alternatively or in addition, it can be provided that system-related active lambda changes, as provided for example for catalytic converter diagnosis, for the diagnosis of exhaust sensors, or in phases of a two-point lambda regulation, are used for the recognition.

Following a measurement in rich lambda region 20 of voltage-lambda characteristic curve 10, a corresponding measurement can take place in lean lambda region 22, and vice versa. In this way, the target lambda is maintained on average over time, and the method can be carried out in emissions-neutral fashion.

According to the present invention, the above method is now carried out until a threshold value of a property of an injected quantity of fuel supplied to the internal combustion engine is exceeded or fallen below. The property is for example an injection time. The threshold value here can standardly be 2.0 ms, preferably 2.5 ms. The threshold value can be modifiable as a function of at least one operating point of the internal combustion engine. The operating point can for example be selected from the group made up of: lowering of a rail pressure of the internal combustion engine, single injection, injection angle displacement, and switching off of at least one cylinder. To carry out the method, and in particular the first method step and the second method step, waiting can take place until the threshold value is exceeded, based on an operating point of the internal combustion engine. In the context of the present invention, this procedure is also referred to as a passive method. Alternatively or in addition, an operating point of the internal combustion engine is changed in such a way that the threshold value is exceeded. In the context of the present invention, this procedure is also referred to as an active method. The method can be carried out repeatedly. The method can for example be carried out after waiting has taken place until the threshold value has been exceeded, based on an operating point of the internal combustion engine, and subsequently the method is carried out until an operating point of the internal combustion engine has been changed in such a way that the threshold value is exceeded. The method can be carried out after an operating point of the internal combustion engine has been changed in such a way that the threshold value has been exceeded and subsequently the method was carried out after waiting has taken place until the threshold value is exceeded, based on an operating point of the internal combustion engine.

In the above-described passive method, the recognition of characteristic change shifts of the two-point lambda sensor is limited to engine operating points having sufficiently long injection times. In other words, waiting takes place until the threshold value of the injection time is exceeded, as a function of engine operating points. In particular, it is provided to limit the recognition of temperature-caused characteristic curve shifts to engine operating points at which the above-described precondition, namely that the change of the composition of the air/fuel mixture takes place with a clearly defined profile, is met. This limitation takes place for example through the threshold value that is used as an activation condition and that prevents the recognition from being activated when injection times are too short. Preferably, a threshold value for the injection time is used below which the waviness of the injection valve characteristic curve does not permit an adequately precise recognition. A typical value for this is 2.5 ms. If the injection time falls below this threshold value, the recognition is not activated. It is advantageous to make the threshold value variable as a function of other conditions, such as the engine operating point.

In the above-described active method, the operating point is changed in order to bring about an exceeding of the threshold value. For example, longer injection times are deliberately brought about during the recognition of characteristic curve shifts of a two-point lambda sensor, because at longer injection times the waviness of the injection valve characteristic curve is standardly small enough that it does not negatively influence the recognition. For this purpose, it is provided that the functionality for recognizing characteristic curve shifts actively requests an increase in the injection times from the engine control system. In order to influence other functionalities in the engine control system as little as possible, this active request preferably takes place only when conditions are present under which the injection time can be increased sufficiently greatly, and under which such an increase can be expected to bring about a successful recognition. Examples of possibilities for increasing the injection time are the lowering of the rail pressure, a single injection instead of a multiple injection, and ignition angle displacement in order to achieve a lower degree of efficiency, or switching off of individual cylinders. The recognition of characteristic curve displacements of the two-point lambda sensor then takes place with higher injection times and thus more precisely. As soon as the recognition is terminated, the injection times can be reduced again. Alternatively, in the above-described active method the operating point can be changed in order to bring about a falling below the threshold value, such as falling below a specified rail pressure or ignition angle.

As a further alternative, the combination of both methods is provided. Here, first the passive method can be used. In this way, it is ensured that the measurements for recognizing characteristic curve displacements are not falsified by too-short injection times. If no recognition is possible over a longer period of time with the passive method, for example because the injection times are too short over a long enough period of time, operating conditions are waited for in which the current injection time is indeed too short but an active injection time would be promising. As soon as this is the case, an increase in the injection time is actively requested, i.e., a change takes place to the active method, and thus a more precise measurement is enabled with longer injection times. Following the recognition, a change is made back to the passive method.

Because an individual measurement is standardly not sufficient for a reliable recognition and compensation of characteristic curve shifts if no measurement at all has previously taken place, for example directly after vehicle assembly or after exchanging the lambda sensor, in such cases it can be advantageous first to activate the active method in order to quickly permit a first reliable compensation, and subsequently to change over to the passive method.

What is claimed is:

1. A method for a two-point lambda sensor that is situated in an exhaust duct of an internal combustion engine and that is used for a regulation setting an air/fuel mixture supplied to the internal combustion engine, the method comprising:
   in a first regulation:
      with reference to voltage and lambda value pairs of a reference voltage-lambda characteristic curve of the two-point lambda sensor, which value pairs each includes a respective voltage value of the sensor and a respective lambda value, changing a composition of the air/fuel mixture supplied to the internal combustion engine from a predefined lambda value to lambda=1; and
      determining a first delay time of the voltage value reaching a value corresponding to the lambda=1 in response to the changing performed in the first regulation;
   in a second regulation:
      with reference to the voltage and lambda value pairs of the reference voltage-lambda characteristic curve, changing the composition of the air/fuel mixture supplied to the internal combustion engine from the predefined lambda value to lambda=1;
      determining a characteristic of the changing of the composition performed in the second regulation based on the first delay time determined for the first regulation;
      determining an actual value of lambda on an actual voltage-lambda characteristic curve of two-point lambda sensor that corresponds to the predefined lambda value of the reference voltage-lambda characteristic curve based on the determined characteristic; and
      identifying a voltage offset of the actual voltage-lambda characteristic curve from the reference voltage-lambda characteristic curve based on a deviation of the actual value of lambda from the predefined lambda value;
   wherein the first and second regulations are carried out responsive to a determination that a threshold value of a property of an injected quantity of fuel supplied to the internal combustion engine is reached.

2. The method of claim 1, further comprising determining a second delay time of the voltage value reaching a value corresponding to the lambda=1 in response to the changing performed in the second regulation, wherein the determined characteristic corresponds to a difference between the first and second delays.

3. The method of claim 1, wherein the property is an injection time.

4. The method of claim 3, wherein the threshold value is 2.0 ms.

5. The method of claim 3, wherein the threshold value is 2.5 ms.

6. The method of claim 1, wherein the threshold value is changed as a function of at least one operating point of the internal combustion engine.

7. The method of claim 6, wherein the operating point is one of: a lowering of a rail pressure of the internal combustion engine, a single injection, an ignition angle displacement, and a switching off of at least one cylinder.

8. The method of claim 1, wherein a performance of the method is delayed until the threshold value is reached passively or an operating point of the internal combustion engine is actively changed in order for the threshold value to be reached for performing the method.

9. The method of claim 8, wherein the method is carried out repeatedly.

10. The method of claim 9, wherein a first performance of the method is carried out after the delaying until the threshold value is reached passively, and subsequently a second performance of the method is carried out after performing an active change to reach the threshold value.

11. The method of claim 9, wherein a first performance of the method is carried out after performing an active change to reach the threshold value, and subsequently a second performance of the method is carried out after the delaying until the threshold value is reached passively.

12. A non-transitory computer-readable medium on which are stored instructions that are executable by a processor and that, when executed by the processor, causes the processor to perform a method for a two-point lambda sensor that is situated in an exhaust duct of an internal combustion engine and that is used for a regulation setting an air/fuel mixture supplied to the internal combustion engine, the method comprising:
   in a first regulation:
      with reference to voltage and lambda value pairs of a reference voltage-lambda characteristic curve of the two-point lambda sensor, which value pairs each includes a respective voltage value of the sensor and a respective lambda value, changing a composition of the air/fuel mixture supplied to the internal combustion engine from a predefined lambda value to lambda=1; and determining a first delay time of the voltage value reaching a value corresponding to the lambda=1 in response to the changing performed in the first regulation;

in a second regulation:

with reference to the voltage and lambda value pairs of the reference voltage-lambda characteristic curve, changing the composition of the air/fuel mixture supplied to the internal combustion engine from the predefined lambda value to lambda=1;

determining a characteristic of the changing of the composition performed in the second regulation based on the first delay time determined for the first regulation;

determining an actual value of lambda on an actual voltage-lambda characteristic curve of two-point lambda sensor that corresponds to the predefined lambda value of the reference voltage-lambda characteristic curve based on the determined characteristic; and identifying a voltage offset of the actual voltage-lambda characteristic curve from the reference voltage-lambda characteristic curve based on a deviation of the actual value of lambda from the predefined lambda value;

wherein the first and second regulations are carried out responsive to a determination that a threshold value of a property of an injected quantity of fuel supplied to the internal combustion engine is reached.

13. An electronic control device comprising a processor, wherein the processor is configured to perform a method for a two-point lambda sensor that is situated in an exhaust duct of an internal combustion engine and that is used for a regulation setting an air/fuel mixture supplied to the internal combustion engine, the method comprising:

in a first regulation:

with reference to voltage and lambda value pairs of a reference voltage-lambda characteristic curve of the two-point lambda sensor, which value pairs each includes a respective voltage value of the sensor and a respective lambda value, changing a composition of the air/fuel mixture supplied to the internal combustion engine from a predefined lambda value to lambda=1; and determining a first delay time of the voltage value reaching a value corresponding to the lambda=1 in response to the changing performed in the first regulation;

in a second regulation:

with reference to the voltage and lambda value pairs of the reference voltage-lambda characteristic curve, changing the composition of the air/fuel mixture supplied to the internal combustion engine from the predefined lambda value to lambda=1;

determining a characteristic of the changing of the composition performed in the second regulation based on the first delay time determined for the first regulation;

determining an actual value of lambda on an actual voltage-lambda characteristic curve of two-point lambda sensor that corresponds to the predefined lambda value of the reference voltage-lambda characteristic curve based on the determined characteristic; and identifying a voltage offset of the actual voltage-lambda characteristic curve from the reference voltage-lambda characteristic curve based on a deviation of the actual value of lambda from the predefined lambda value;

wherein the first and second regulations are carried out responsive to a determination that a threshold value of a property of an injected quantity of fuel supplied to the internal combustion engine is reached.

* * * * *